United States Patent
Wagemans

(10) Patent No.: US 6,360,086 B2
(45) Date of Patent: Mar. 19, 2002

(54) DEVICE FOR GENERATING AN AC AMPLITUDE-DEPENDENT INDICATOR

(75) Inventor: Antonius G. Wagemans, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/257,083

(22) Filed: Feb. 24, 1999

(30) Foreign Application Priority Data

Feb. 26, 1998 (EP) ............................................. 98200609

(51) Int. Cl.[7] ........................ H04B 17/00; G01R 19/22; H03K 3/037

(52) U.S. Cl. ............................. 455/226.4; 455/234.1; 324/119; 327/207

(58) Field of Search ................................ 455/326, 333, 455/69.7, 232.1, 234.1, 205, 226.4, 226.2; 327/58, 355, 357; 330/307, 195, 271; 324/119, 123 R

(56) References Cited

U.S. PATENT DOCUMENTS

| | | | | |
|---|---|---|---|---|
| 3,668,533 A | * | 6/1972 | Fish et al. ................... | 327/306 |
| 3,760,255 A | * | 9/1973 | Grodinsky .................. | 327/104 |
| 3,918,003 A | * | 11/1975 | Seidel ......................... | 330/279 |
| 4,128,810 A | * | 12/1978 | Ogita ...................... | 455/155.1 |
| 4,219,778 A | * | 8/1980 | Ishii ............................ | 455/205 |
| 4,309,656 A | | 1/1982 | Okanobu ..................... | 324/123 |
| 4,379,272 A | * | 4/1983 | Wheatley ..................... | 332/162 |
| 4,513,209 A | * | 4/1985 | Tanabe et al. ................ | 327/58 |
| 4,587,495 A | * | 5/1986 | Osawa et al. ................ | 330/311 |
| 4,607,234 A | * | 8/1986 | Nordholt et al. ............. | 330/278 |
| 4,620,114 A | * | 10/1986 | Moon ........................... | 327/58 |
| 5,061,903 A | * | 10/1991 | Vasile .......................... | 330/311 |
| 5,107,487 A | * | 4/1992 | Vilmur et al. ................ | 370/342 |
| 5,193,210 A | * | 3/1993 | Nicholas et al. ............ | 455/38.1 |
| 5,301,364 A | * | 4/1994 | Arens et al. ................... | 455/69 |
| 5,303,410 A | * | 4/1994 | Horigome ................ | 455/226.4 |
| 5,423,078 A | * | 6/1995 | Epperson et al. ............. | 455/89 |
| 5,489,868 A | | 2/1996 | Gilbert ........................ | 327/351 |
| 5,507,023 A | * | 4/1996 | Suganuma et al. ....... | 455/234.1 |
| 5,770,962 A | * | 6/1998 | Aebischer .................... | 327/307 |
| 5,790,943 A | * | 8/1998 | Fotowat-Ahmady et al. .... | 455/226.2 |
| 5,880,633 A | * | 3/1999 | Leizerovich et al. .......... | 330/84 |
| 6,064,238 A | * | 5/2000 | Wight et al. .................. | 327/58 |
| 6,070,058 A | * | 5/2000 | Waldroup et al. ............. | 455/69 |

FOREIGN PATENT DOCUMENTS

EP    0152985 A1   8/1985   ............ H03G/3/30

* cited by examiner

*Primary Examiner*—Lester G. Kincaid
*Assistant Examiner*—Charles N. Appiah
(74) *Attorney, Agent, or Firm*—Theodore N. Mak

(57) ABSTRACT

A device for generating an indicator signal that corresponds to an AC signal amplitude is configured such that the DC current drawn by the device is substantially proportional to the AC signal amplitude. The device is particularly well suited for automatic gain control of low-power communications equipment.

10 Claims, 3 Drawing Sheets

DEVICE FOR GENERATING AN AC AMPLITUDE-DEPENDENT INDICATOR

Figure 1:
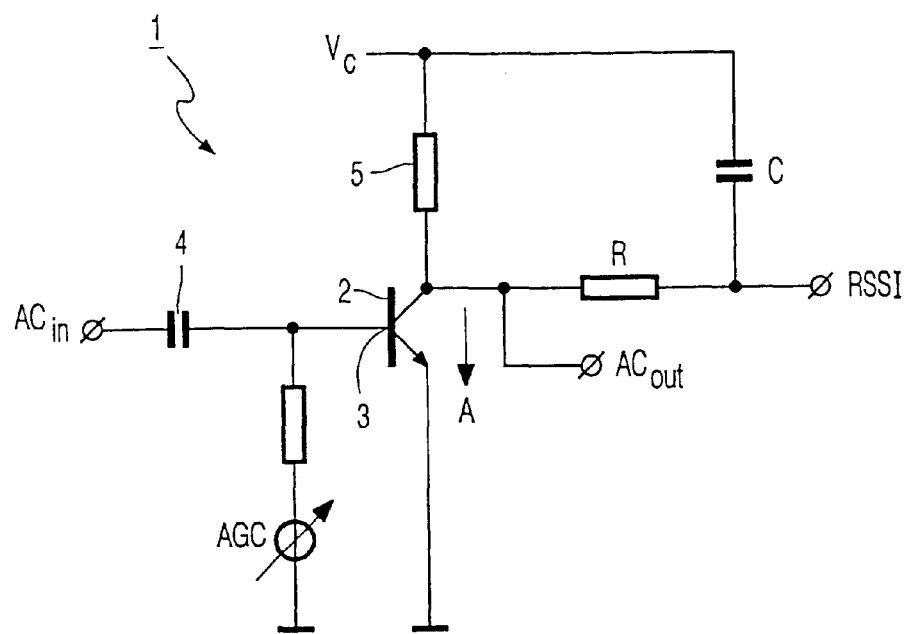

The present invention relates to a device for generating an indicator signal which is representative of an AC signal amplitude input to the device.

The present invention also relates to the use of such an indicator signal, to a base station, a handset and to a receiver or transceiver provided with such a device and to a network including a base station and handset.

Such a device is known from our European patent application EP-A-0 152 985. The device disclosed therein is a high-frequency amplifier arrangement for generating an indicator signal which is representative of an AC signal amplitude in the device. For the known device to generate an indicator signal which is used to control the gain in amplifier stages in the device an, IF signal on input $S_{i1}$ is being AM detected to reveal the automatic gain control (AGC) indicator signal. The AGC uses a broadband AM detector to cope with the full frequency range of the AC signal. To achieve that goal, the known device is not a low power consuming device and is therefore not suitable for application in an environment where a low power consumption is required such as in portable or mobile devices, such as telephones, base stations, handsets, and pagers.

It is an object of the present invention to provide a low power consuming device over a broad frequency range, which device is capable of being used as an RSSI (Received Signal Strength Indicator), such as in AGC. Thereto the device according to the present invention is characterized in that the device comprises at least one semiconductor whose DC bias current is representative of said AC signal amplitude, and means for deriving the indicator signal from the DC bias current. A low DC bias current flows through the semiconductor if a zero AC signal amplitude is input and the DC bias current is related to the input AC signal amplitude. This reduces the power consumption of the device according to the present invention as no DC current is spilt. It is a further advantage of the device according to the invention that the means for deriving the indicator signal can be embodied as averaging or low-pass means which are both simple and require little power. In addition it is an advantage that a variety of practical implementations embodying the principle of a DC bias current representing the AC signal amplitude can be realised.

The device can advantageously be used for controlling the gain in an amplifier circuit, such as in a receiver or transceiver in a base station and/or handset in a network, such as a communication network for minimizing gain to reduce the power consumption and in particular for minimizing RF power supplied to the air in order to furthermore minimize mutual disturbance between communicating parties in the network.

Figure 2:
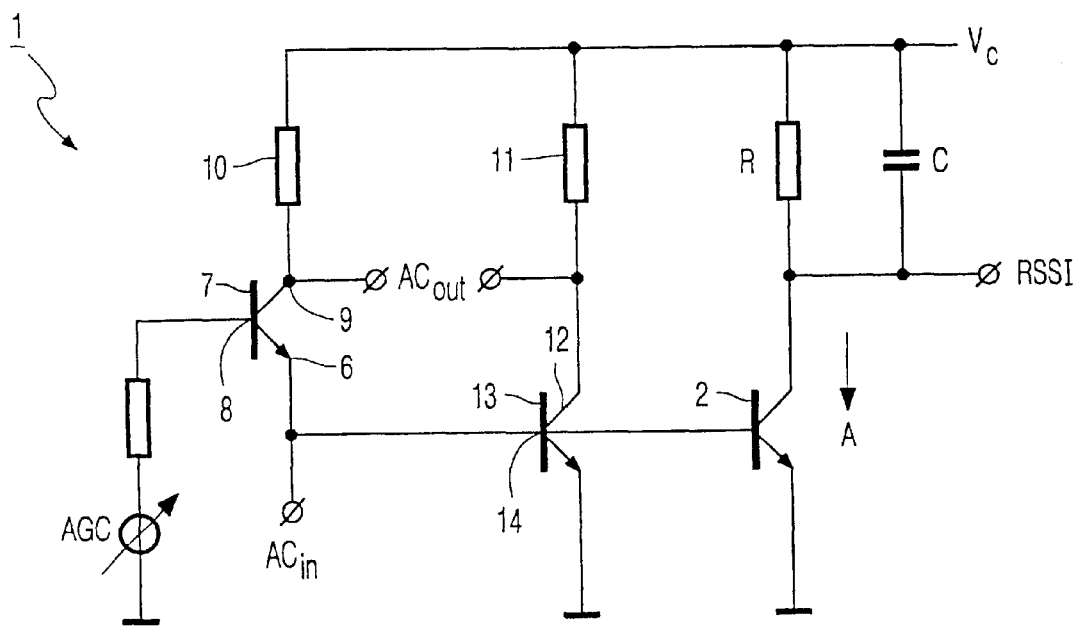
Figure 3:
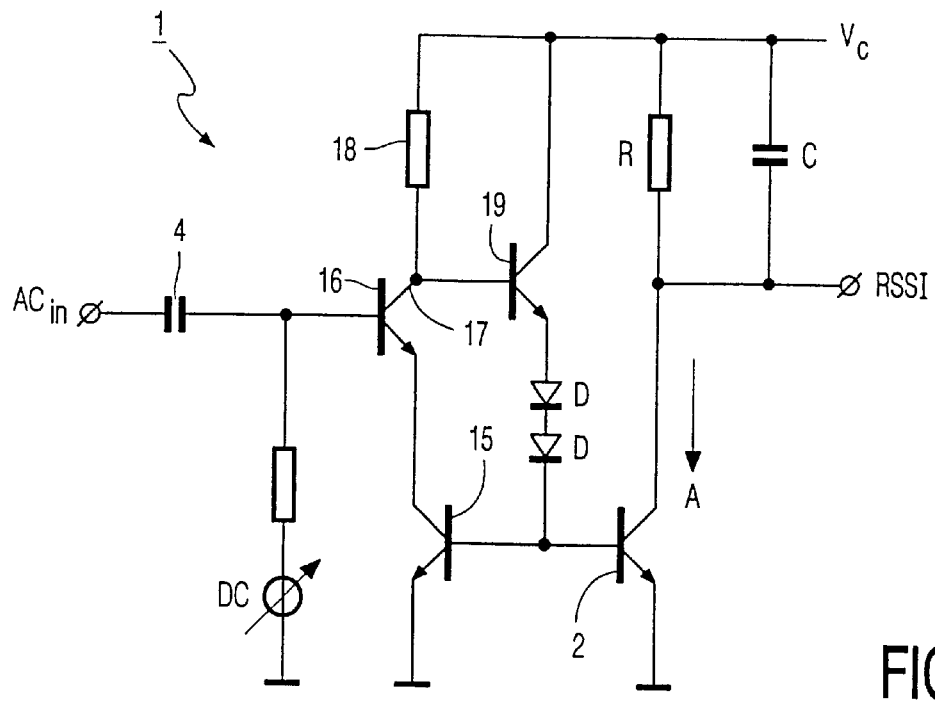
Figure 4:
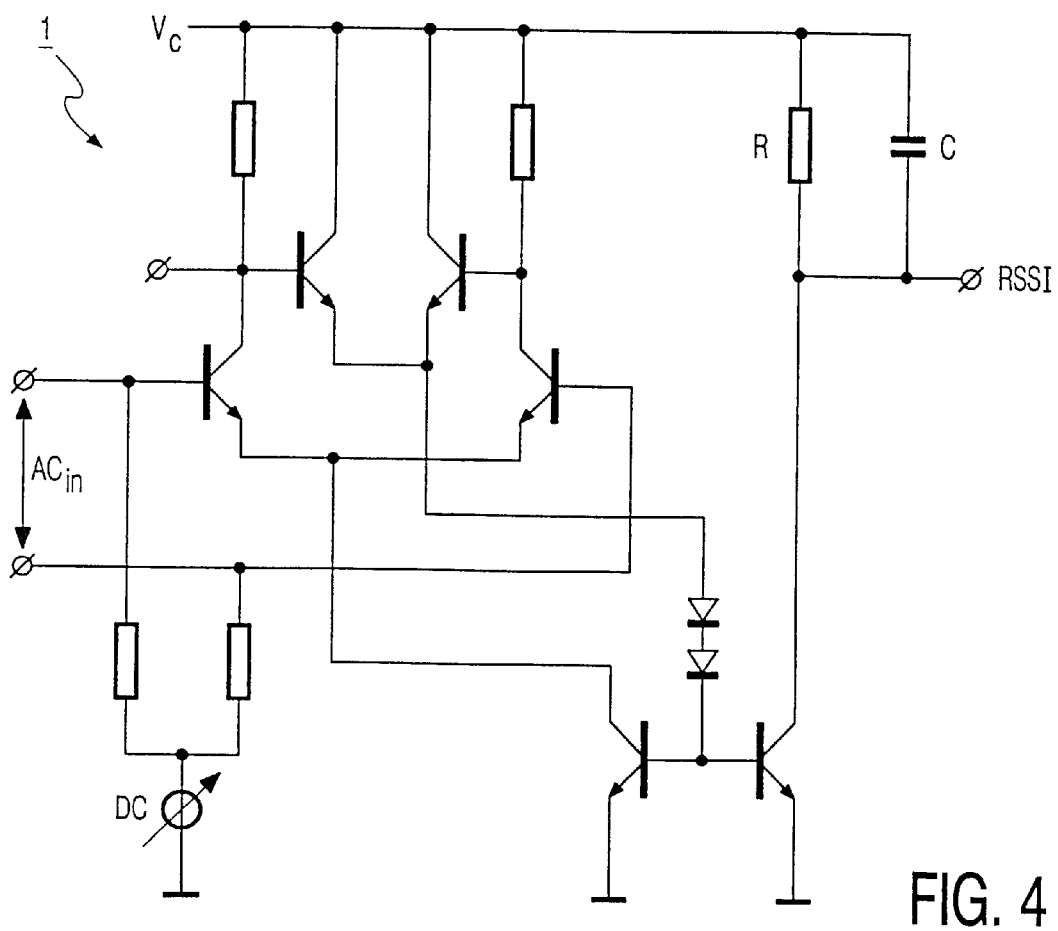
Figure 5:
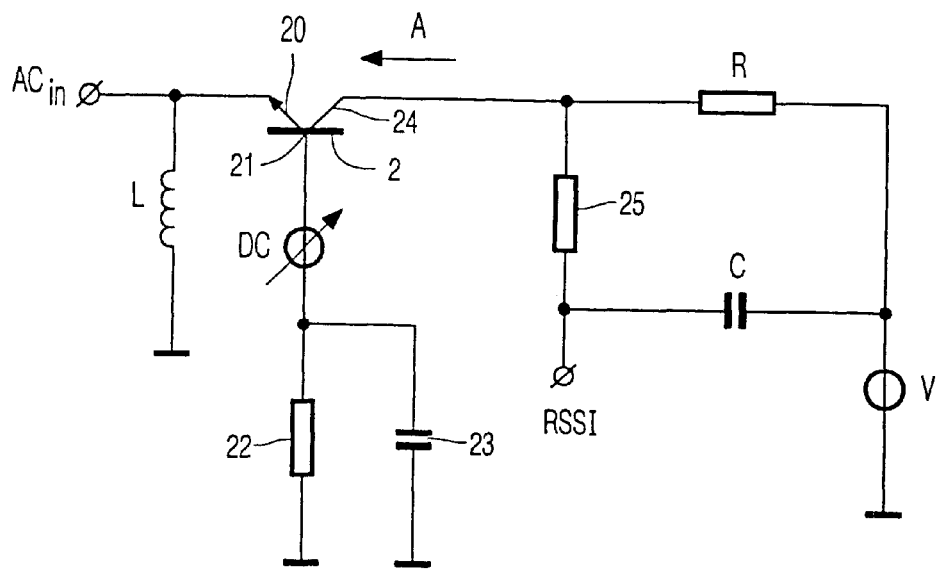
Figure 6:
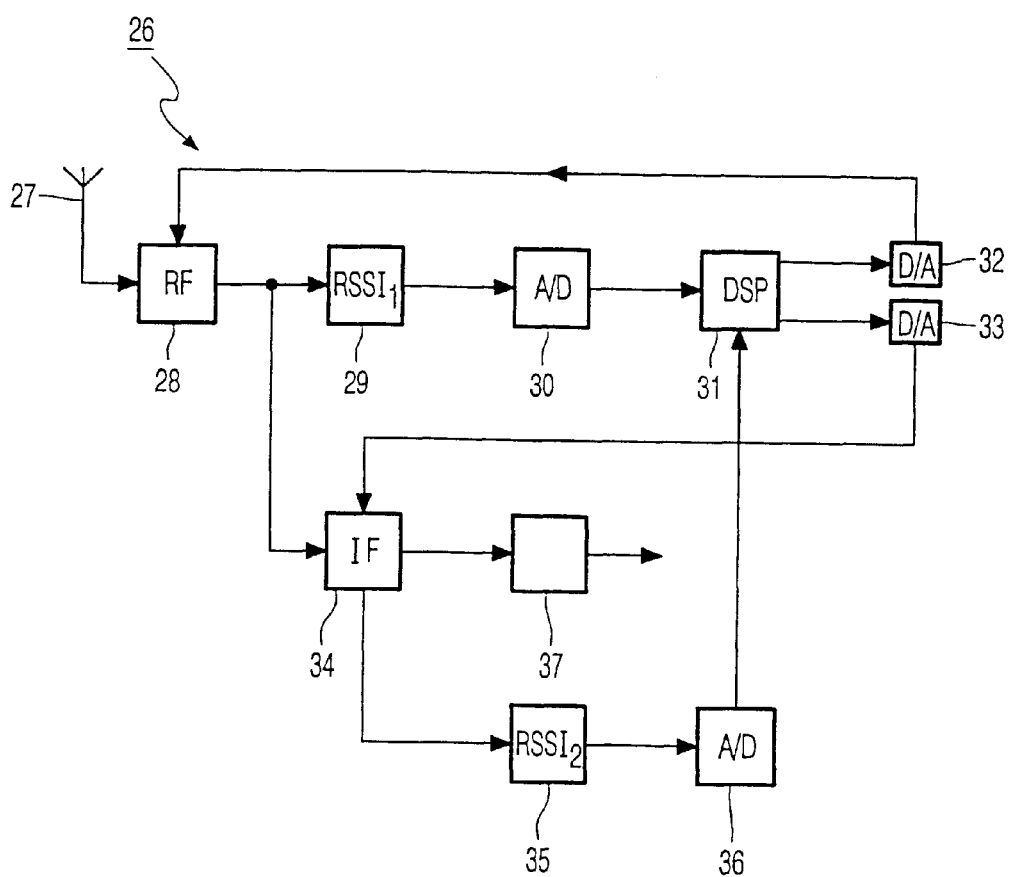

At present the device according to the invention will be elucidated further together with its additional advantages while reference is being made to the appended drawing, wherein like components are referred to by like reference numerals. In the drawing:

FIG. 1 shows a simple first embodiment of the device according to the invention for generating a received signal strength indicator (RSSI) signal FIG. 2 shows a second embodiment of the device according to the invention having a balanced RF signal output and current mirror means, FIG. 3 shows a third embodiment of the device according to the invention embodied by a current mirror means, FIG. 4 shows a fourth embodiment of the device according to the invention, FIG. 5 shows a fifth embodiment of the device according to the invention having a semiconductor connected in the common base circuit, and FIG. 6 shows an embodiment of a block diagram of a handset comprising a receiver according to the invention wherein two devices used as received RF and IF signal strength indicator (RSSI) devices are used respectively.

FIGS. 1–5 show embodiments of a device 1, comprising the main stream path designated A of a semiconductor 2, such as a bipolar transistor as shown or possibly a FET, MOS-FET or another controllable semiconductor possibly adjusted in class A/B, class B, class C or even class D. The transistor 2 has a collector-emitter path forming the main DC bias current path A. The transistor 2 has a base 3 in the embodiment as shown forming a control input to which, through a capacitor 4, an AC input signal, such as an RF or an IF or LF signal having a certain amplitude or strength, is applied. The semiconductor has a curved, viz. an exponential or a quadratic control input characteristic area, as is the case with a bipolar transistor or a FET, respectively. The DC bias current of the semiconductor 2 in the FIGS. 1–5, if adjusted in this curved area, provides for the feature that the AC signal amplitude applied thereto results in a DC bias current, which is representative of the AC signal amplitude of the signal on input AC. The DC bias current, if fed through a resistor 5 connected to the supply voltage $V_c$ of the device 1, provides an AC output signal on $AC_{out}$ containing the DC bias component, which in turn is fed to further means RC for deriving an indicator signal RSSI from the DC bias current. In particular the means RC comprise an RC low-pass filter as shown, or possibly an LR low-pass filter (not shown) for providing the indicator voltage signal RSSI, which is representative of the AC signal amplitude input to the device 1. A low DC bias current flows through the main current path A if a zero amplitude AC signal is input. The RSSI signal may be fed back to the base 3 of the transistor 2 which is schematically shown by a controllable DC voltage source AGC. This AGC reduces the DC bias current which reduces the current consumption of the device 1 even further.

FIG. 2 shows a second embodiment of the device 1, wherein the AC signal is input on an emitter 6 of a transistor 7 connected in a common base circuit, whose base 8 is connected to the AGC as explained in relation to FIG. 1 and whose collector 9, being connected to $V_c$ through resistor 10, forms one terminal of a balanced AC output. The other terminal of the balanced AC output is connected to a $V_c$ coupled resistor 11 and to a collector 12 of a transistor 13, whose base 14 is connected to $AC_{in}$ and whose collector-emitter main current path is mirrored in the path A of the part of the device 1 the functioning whereof has already been described in relation to FIG. 1.

A third embodiment of the device 1 is shown in FIG. 3 where the main current in path A is now mirrored in the collector-emitter current path of a transistor 15 which DC level is again representative of the input AC signal magnitude passed through a transistor 16 whose collector 17 is connected to a $V_c$ resistor 18 and a further transistor 19 providing base control through two junctions D to mirrored transistors 2 and 15. Voltage source DC provides DC input adjustment of transistor 16.

A fourth embodiment of the device 1 is shown in FIG. 4. This embodiment is also outlined and explained in relation to its functioning as an amplifier having improved large AC signal behaviour as disclosed in EP application number 97201944.2 (see FIGS. 1 and 2 therein) filed Jun. 25, 1997, which is incorporated here by reference. It turned out that this amplifier, if provided with mirroring transistor 2 and the low-pass means such as RC and explained hereinbefore can also be used for generating the RSSI signal now desired.

FIG. 5 presents a fifth schematic basic embodiment of the device 1 wherein the transistor 2 is now connected in the common base circuit. AC is input to emitter 20 of transistor 2 through parallel coil L which prevents leakage to ground. Base 21 thereof is DC voltage controlled by voltage source DC, which is connected in series with resistor 22 in a parallel combination with capacitor 23. Collector 24 of the transistor 2 is connected to a resistor 25 and the RC means described earlier, which means in turn is connected to voltage source V. Again at output RSSI the indicator signal is generated which is representative of the input AC signal amplitude. If so required, path A could be mirrored as described earlier too.

The possible use of the RSSI signal in a receiver or transceiver in a handset 26 such as used in a telephone network, is explained with reference to FIG. 6. The handset 26 comprises an antenna 27 coupled to a receiving part as shown which includes an RF amplifier 28, a received RF signal strength indicator device 29, a first A/D convertor 30, a digital signal processing (DSP) circuit 31 connected to D/A convertors 32 and 33, an IF amplifier 34 connected to the RF amplifier 28, a received IF signal strength indicator 35 and a second A/D convertor 36 coupled to DSP circuit 31. For achieving AGC, the D/A convertors 32 and 33 are connected to RF amplifier 28 and IF amplifier 34, respectively. The arrangement of particularly the RSSI circuits 29 and 35 allow separate RF signal and IF signal gain control for minimizing power consumption in the handset 28 and for minimizing RF power to be generated in a communication network, thus minimizing mutual disturbance between parties in the network. The IF amplifier 34 is connected to a data processing circuit 37 for outputting the desired data.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A circuit adapted to receive an AC signal, and further adapted to provide an amplified AC signal as a first output, and to provide a signal representative of the magnitude of the received AC signal as a second output, comprising:

an AC signal input terminal coupled to a first terminal of a first capacitor;

a bias network, having one terminal coupled to a first power supply node, the bias network operable to provide current so as to produce a variable voltage at a second terminal of the bias network;

a first current-controlled semiconductor device having a first terminal, a second terminal, and a third terminal, the first terminal coupled to the second terminal of the bias network and further coupled to a second terminal of the first capacitor;

a first load element coupled in series between a second power supply node and the second terminal of the first current-controlled semiconductor device; and a low-pass filter, coupled between the second terminal of the current-controlled semiconductor device and the second power supply node;

wherein the bias network is configured such that, in operation, the current flow in the current-controlled semiconductor device is reduced when the received AC signal is nominally zero, as compared to when the received AC signal is non-zero.

2. The circuit of claim 1, wherein the third terminal of the first current-controlled semiconductor device is couple to the first power supply node, the first current-controlled semiconductor device is a bipolar transistor, the first load element is a resistor, the low-pass filter comprises a resistor and a capacitor connected in series, and further comprising a feedback pathway between an output node of the low-pass filter and a control input terminal of the bias network.

3. The circuit of claim 2, wherein the bipolar transistor is an NPN bipolar transistor.

4. The circuit of claim 2, wherein the first power supply node is a ground node, and the second power supply node, when in operation, has a voltage thereon which is positive with respect to ground.

5. A circuit adapted to receive an AC signal, and further adapted to provide a signal representative of the magnitude of the received AC signal as a first output, comprising:

an AC signal input terminal coupled to a first terminal of a first capacitor;

a bias network, having one terminal coupled to a first power supply node, the bias network operable to provide current so as to produce a variable voltage at a second terminal of the bias network;

a first transistor having a base, a collector, and an emitter, the base coupled to the second terminal of the bias network and further coupled to a second terminal of the first capacitor;

a first load element coupled in series between a second power supply node and the collector of the first transistor;

a second transistor having a base, a collector, and an emitter, the collector of the second transistor coupled to the emitter of the first transistor, and the emitter of the second transistor coupled to the first power supply node a third transistor having a base, a collector, and an emitter, the third transistor base couple to the second transistor base, and the third transistor emitter coupled to the first power supply node;

a second load element coupled in series between the second power supply node and the collector of the third transistor;

a fourth transistor having a base, a collector and an emitter, the fourth transistor base coupled to the first transistor collector, and the fourth transistor collector coupled to the second power supply node; and at least one diode coupled between the fourth transistor emitter and the base of both the second and third transistors;

wherein the bias network is configured such that, in operation, the current flow in the first, second, and third transistors, is reduced when the received AC signal is zero, as compared to when the received AC signal is non-zero.

6. The circuit of claim 5, further comprising a capacitor coupled between the second power supply node and the collector of the third transistor.

7. The circuit of claim 5, wherein the at least one diode comprises two diodes coupled such that current may flow from the emitter of the fourth transistor to the bases of the second and third transistors; and further comprising a feedback pathway coupled between a control input terminal of the bias network and the collector of the third transistor.

8. The circuit of claim 7, wherein the first, second, third, and fourth transistors are NPN transistors.

9. The circuit of claim 5, further comprising a fifth transistor having a base, a collector, and an emitter, the fifth transistor collector coupled to the second power supply node, and the fifth transistor emitter coupled to the emitter of the fourth transistor.

10. The circuit of claim 9, further comprising a sixth transistor having a base, a collector, and an emitter, the sixth transistor collector coupled to the fifth transistor base, the sixth transistor emitter coupled to the first transistor emitter, and the sixth transistor base coupled to the bias network.

* * * * *